(12) United States Patent
Deane et al.

(10) Patent No.: US 7,007,835 B2
(45) Date of Patent: Mar. 7, 2006

(54) SOLDER BONDING TECHNIQUE FOR ASSEMBLING A TILTED CHIP OR SUBSTRATE

(75) Inventors: Philip Deane, Indian Harbour Beach, FL (US); Neil Teitelbaum, Ottawa (CA)

(73) Assignees: JDS Uniphase Corporation, San Jose, CA (US); JDS Uniphase Inc., Ottawa (CA)

( * ) Notice: Subject to any disclaimer, the term of this patent is extended or adjusted under 35 U.S.C. 154(b) by 0 days.

(21) Appl. No.: 10/775,395

(22) Filed: Feb. 10, 2004

(65) Prior Publication Data

US 2004/0182913 A1    Sep. 23, 2004

Related U.S. Application Data

(63) Continuation-in-part of application No. 10/152,641, filed on May 21, 2002, now abandoned.

(60) Provisional application No. 60/291,948, filed on May 21, 2001.

(51) Int. Cl.
*B23K 35/38* (2006.01)
(52) U.S. Cl. .................. 228/180.22; 228/246
(58) Field of Classification Search ......... 228/180.22, 228/246; 257/737, 738; 438/613
See application file for complete search history.

(56) References Cited

U.S. PATENT DOCUMENTS

| | | | |
|---|---|---|---|
| 4,893,403 A * | 1/1990 | Heflinger et al. | 29/840 |
| 5,963,793 A | 10/1999 | Rinne et al. | 438/107 |
| 6,053,395 A | 4/2000 | Sasaki | 228/180.22 |
| 6,179,196 B1 | 1/2001 | Heim et al. | 228/6.1 |
| 6,418,033 B1 | 7/2002 | Rinne | 361/784 |
| 6,435,401 B1 | 8/2002 | Miitsu et al. | 228/264 |
| 6,455,933 B1 | 9/2002 | Akram et al. | 257/738 |
| 6,461,881 B1 | 10/2002 | Farnworth et al. | 438/15 |
| 6,518,677 B1 | 2/2003 | Capote et al. | 257/783 |
| 6,635,960 B1 | 10/2003 | Farrar | 257/723 |

* cited by examiner

*Primary Examiner*—Len Tran
(74) *Attorney, Agent, or Firm*—Allen, Dyer, Doppelt Milbrath & Gilchrist, P.A.

(57) ABSTRACT

A method for solder bonding a photodiode or an array of photodiodes to a substrate, the photodiode(s) tilted at a predetermined angle, uses a pair solder bumps placed on a photodiode chip opposite a corresponding pair of solder pads placed on the substrate. When the photodiode chip is placed on the substrate, with the solder bumps therebetween, the solder is melted and undergoes a reflow over the surface of the pads. The shape of the pads and the location of the solder bumps on the pads causes the surface tension of the solder to tilt the chip by pulling it to one side.

17 Claims, 13 Drawing Sheets

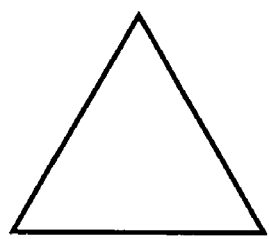
FIG. 5
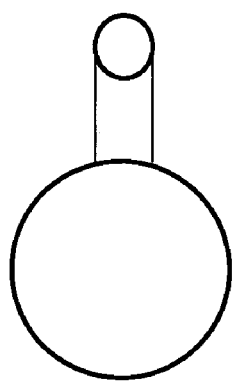
Alternative Pad Shapes
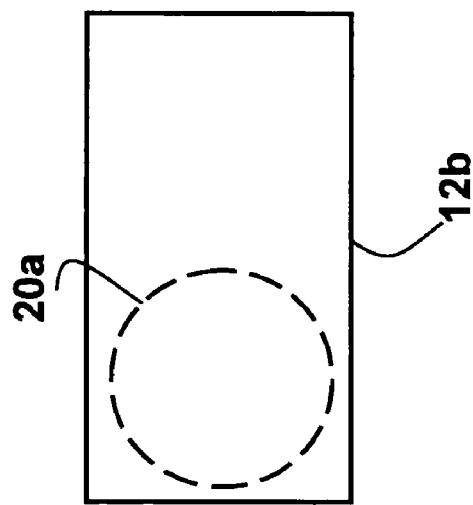
FIG. 5a

Side View

Front View

SOLDER BONDING TECHNIQUE FOR ASSEMBLING A TILTED CHIP OR SUBSTRATE

RELATED APPLICATIONS

This application is a Continuation-in-part application and claims priority from U.S. patent application Ser. No. 10/152,641 filed May 21, 2002, now abandoned and from U.S. provisional application No. 60/291,948 filed May 21, 2001.

FIELD OF THE INVENTION

This invention relates to techniques for mounting elements on a substrate, or for mounting one substrate to another and more specifically, in one aspect, to a method of soldering a plurality of small electronic elements such as photodiodes, to a substrate.

BACKGROUND OF THE INVENTION

U.S. Pat. No. 6,635,960 in the name of Farrar Oct. 21, 2003 teaches that the chips would be positioned at the desired angle prior to attaching the first connecting member to the second connecting member; Flip chip technology is well known, for example the process is described in U.S. Pat. No. 6,053,395 in the name of Sasaki, and in United States Patent. U.S. Pat. No. 5,963,793 in the names of Rinne and Deane, the applicant of this application, describes a flip-chip solder bump technique for where after reflow, a solder bump which extends across a pair of adjacent substrates forms an arched solder column or partial ring of solder between the two substrates. This allows one substrate to be soldered to another with an oblique angle therebetween.

In edge emitting laser diode systems, a monitor photodiode is used in a feedback loop to control the laser chip's power output. The photodiode's active surface must be pointed toward the laser chip's backside facet. The angle between the photodiode's active surface and the incident laser beam from the laser chip does not need to be 90 degrees; angles between 30 and 60 degrees are acceptable.

Power monitoring photodiodes used in edge emitting pump and source lasers are often assembled in a manner to receive an optical beam and convert the optical signal into an electrical one. Typically, the photodiode is mounted to a submount that is then joined to a substrate that includes the edge emitting laser chip. The submount is assembled to the substrate such that the photodiode is perpendicular to the light path from the laser chip (FIG. 1).

It is known to mount elements on a substrate using solder bumping or solder printing. Flip-chip technology is also well known in the art. Generally, flip-chip technology involves chips with numerous solder bump interconnection terminals. After solder joining the chip to a substrate, the arrangement of solder bumps results in the chip being oriented substantially parallel to the substrate, assuming that all the bumps are of substantially equal size. U.S. Pat. No. 6,418,033 in the name of Rinne assigned to Unitive Electronics, Inc., incorporated herein by reference discloses mounting a plurality of substrates on solder bumps mounted to a first microelectronic substrate as a means of increasing packing density. Customarily in the art, when two circuit boards are to be physically connected to one another with a predetermined angle therebetween, it can be achieved between by heating the solder bumps so as to cause it them reflow while holding the element with respect to the substrate at a predetermined desired angle during the reflow process. The melted solder bumps form the "glue" and electrical contact if it is so required, and when the solder cools and solidifies, the element that was held in place at a desired angle, is fixed at that angle. If there are just two solder bumps or if the bumps are arranged in a line, the chip resting upon them would be unstable during the solder joining process and it would tend to tilt to one side or the other. This behaviour is the basis of the present invention.

It would be desirable to provide a controllable method of assembling one or many small electronic elements such as photodiodes at a predetermined angle to the substrate, using soldering or an equivalent approach. The angle is measured between the main surface of the substrate and the major surface of the element or elements.

It would be desirable to provide a controllable method of assembling one or many small circuit boards to the substrate, using soldering or an equivalent approach. The angle is measured between the main surface of the substrate and the major surface of the circuit board or boards.

SUMMARY OF THE INVENTION

In accordance with the invention, there is provided, a method of bonding an element to a substrate, the method comprising the steps of:
  a) providing a substrate having a generally flat surface,
  b) placing two or more solder bumps having a predetermined volume on either the substrate or on the element, the bumps defining a single axis,
  c) determining a shape, size and location of two or more solder pads on the other of the substrate or element so as effect a predetermined orientation of the element at a predetermined angle with respect to the substrate during heating and melting of the solder bumps,
  d) effecting a contact of the element with the substrate via the solder bumps, such that the element is secured to and supported on the solder bumps only, and
  e) after step (d) heating the solder bumps in the absence of any further supporting or orienting of the element to cause a flow of the solder bumps and to cause a predetermined tilting displacement of the element by gravity forces and by surface tension forces substantially about the axis defined by the solder bumps so as to orient the element at a predetermined angle between angles greater than 0 and less than 90 degrees with respect to the substrate by said heating alone.

In accordance with one aspect of the invention, there is provided a method of bonding an element to a substrate at an angle, the method comprising the following steps, not necessarily in the listed order:
  a) providing a substrate having a generally flat surface,
  b) placing two or more solder bumps on either the substrate or on the element, the bumps defining a single axis,
  c) providing means for asymmetrical flow of the solder bumps upon melting,
  d) effecting a contact of the element with the substrate through the solder bumps, and
  e) heating the solder bumps to cause a non-uniform flow of the solder bumps and a tilting displacement of the element substantially about the axis defined by the solder bumps.

The step d) may be preceded by a step of temporarily attaching the element to a transfer plate or an equivalent transfer device. The step e) is usually followed by natural or forced cooling of the solder bumps to develop a working, fixed connection between the element and the substrate.

In accordance with another embodiment of the invention, an assembly is provided inclding an element having two solder pads connected and supported by at least two solder bumps to two solder pads on a substantially planar substrate, the element being at predetermined second angle to the substrate, the angle being between 0 and 90 degrees, the element having been moved from a first angle into the second angle by heating of the solder bumps alone, in the absence of other fixturing to hold the element in said second predetermined angle during said heating, at least two of the solder pads on at least one of the planar substrate and the element being sized and located in such a manner as to allow surface tension forces of the solder upon melting to pull the element into the second predetermined angle in the absence of further machine or human intervention, wherein the first angle differs from the second predetermined angle by at least 10 degrees.

In an embodiment of the invention, the element is of sufficiently small dimensions to match the size of a typical solder bump i.e. from several microns to a few millimetres. The element may be a photodiode. In an embodiment of the invention, the element may be mounted on a submount our may be a submount or substrate.

BRIEF DESCRIPTION OF THE DRAWINGS

The invention will now be explained in more detail by way of the following description to be taken in conjunction with the drawings in which FIG. 5 shows alternative shapes of the pads, FIG. 5a shows a symmetric circular shaped solder bump placed asymmetrically on a rectangular symmetrically shaped pad.

DETAILED DESCRIPTION OF THE EMBODIMENTS OF THE INVENTION

Figure 1:
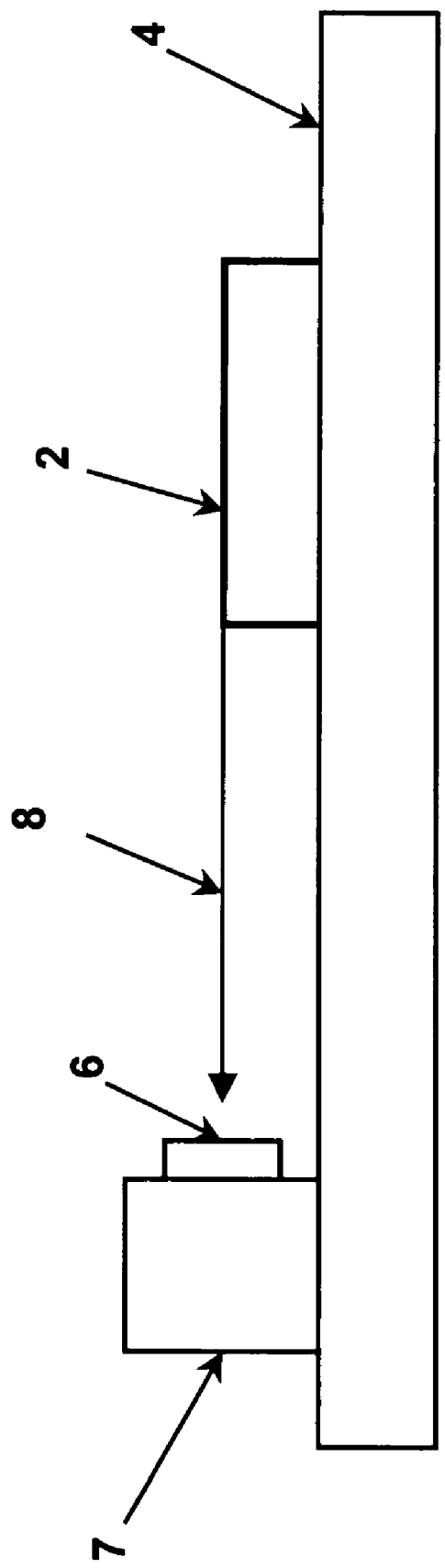
FIG. 1 is a side view of a typical, prior art arrangement combining an edge emitting laser diode and monitor photodiode.

Turning now to FIG. 1, a laser diode 2 is shown mounted on a substrate 4. A photodiode 6, affixed to a submount 7, is also secured to the substrate 4. The laser diode emits an optical beam 8 towards the photodiode.

Figure 2:
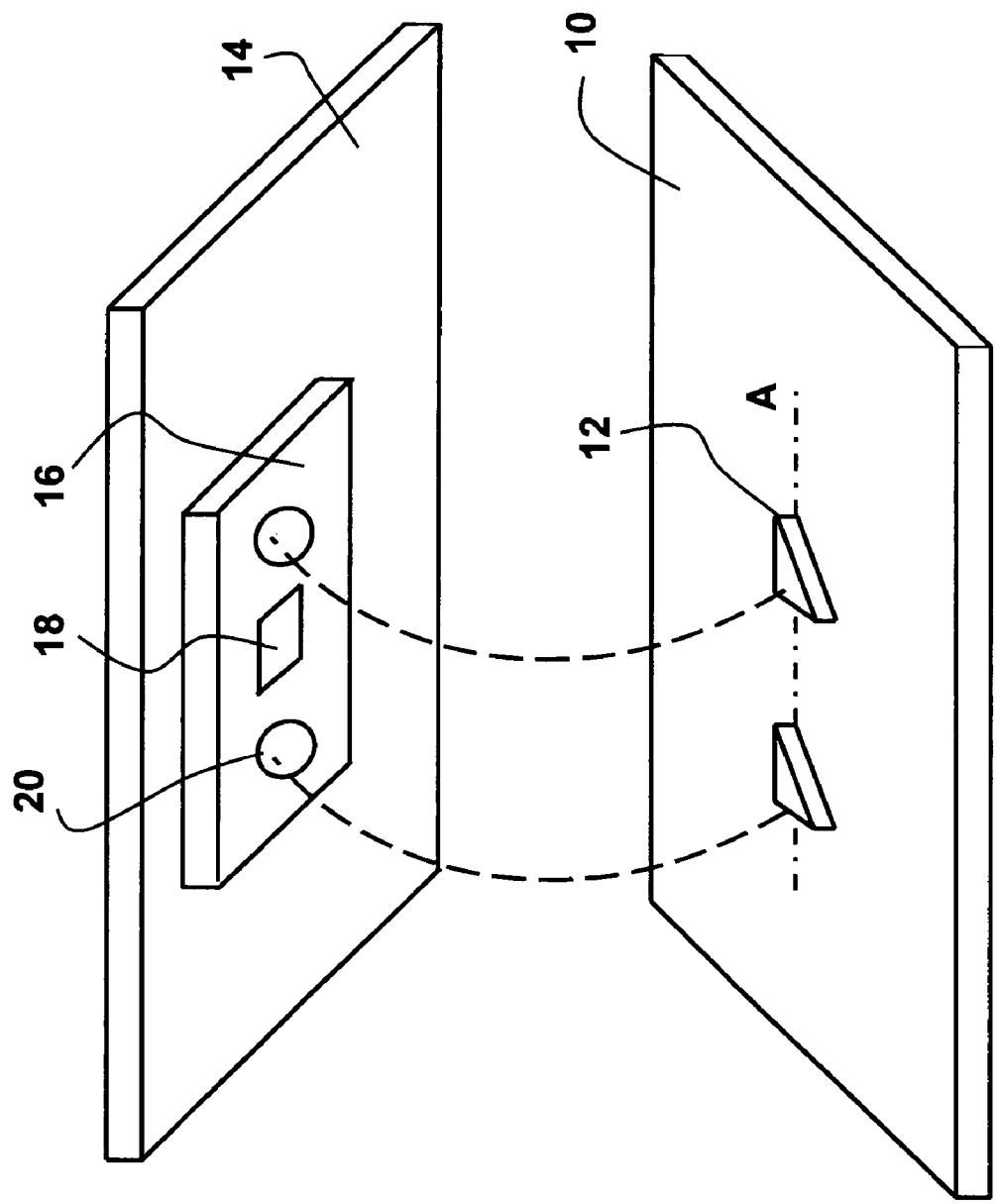
FIG. 2 is an isometric view of the substrate and a photodiode chip mounted on a transfer plate before the assembly, for ease of viewing.

FIG. 2 shows a substrate 10 with two solder pads 12. The material of the substrate and the pads is conventional. The pads 12 have a non-symmetrical shape relative to an imaginary line, or axis A, connecting geometrical centers of the pads. In the embodiment illustrated herein, the shapes are identical triangles, not necessarily of exact geometrical shape. As illustrated in FIG. 5, other asymmetrical shapes are also acceptable for the purpose of the invention.

A die placement machine with a pick-up head 14 is shown with a photodiode chip 16 held in position thereon. The chip has a diode active area 18 and two round solder bumps 20. The solder may be a conventional Pb/Sn solder or another solder commonly used in the art. The size of the bumps 20 and their distribution is selected to match the size and distribution of the pads 12 on the substrate 10. More specifically, the size of the bumps may be such that the solder, when melted, covers at least most of the surface of the respective pad and still forms a relatively thick layer, sufficient to flow and form a "hill" with a slope enabling the chip to tilt as will be explained and illustrated hereinbelow.

Figure 3:
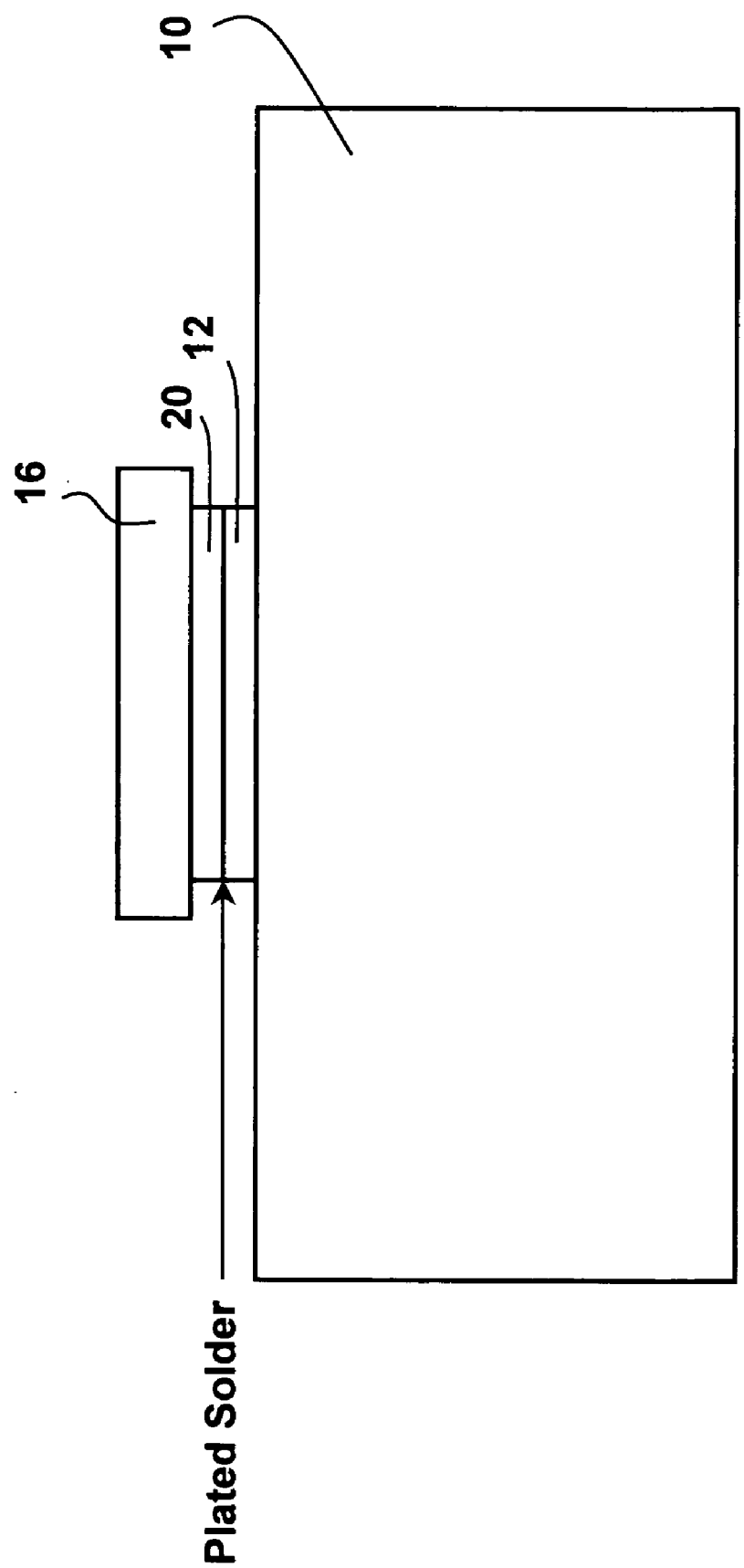
FIG. 3 is a side view of the substrate and the photodiode chip after contact and initial heating and cooling of the solder.

In accordance with the invention, the chip (or another element) is temporarily immobilized on the substrate by bringing the chip in contact with the pad via the solder, and then by controlled heating and cooling of the solder. The result is shown in FIG. 3. The chip 16 is shown after its release from the pick-up head 14. It will be recognized that the method for placing the chip is not a prerequisite for the invention and other methods of bringing the chip in contact with the substrate can easily be conceived by a person with average skill in the art.

Figure 4:
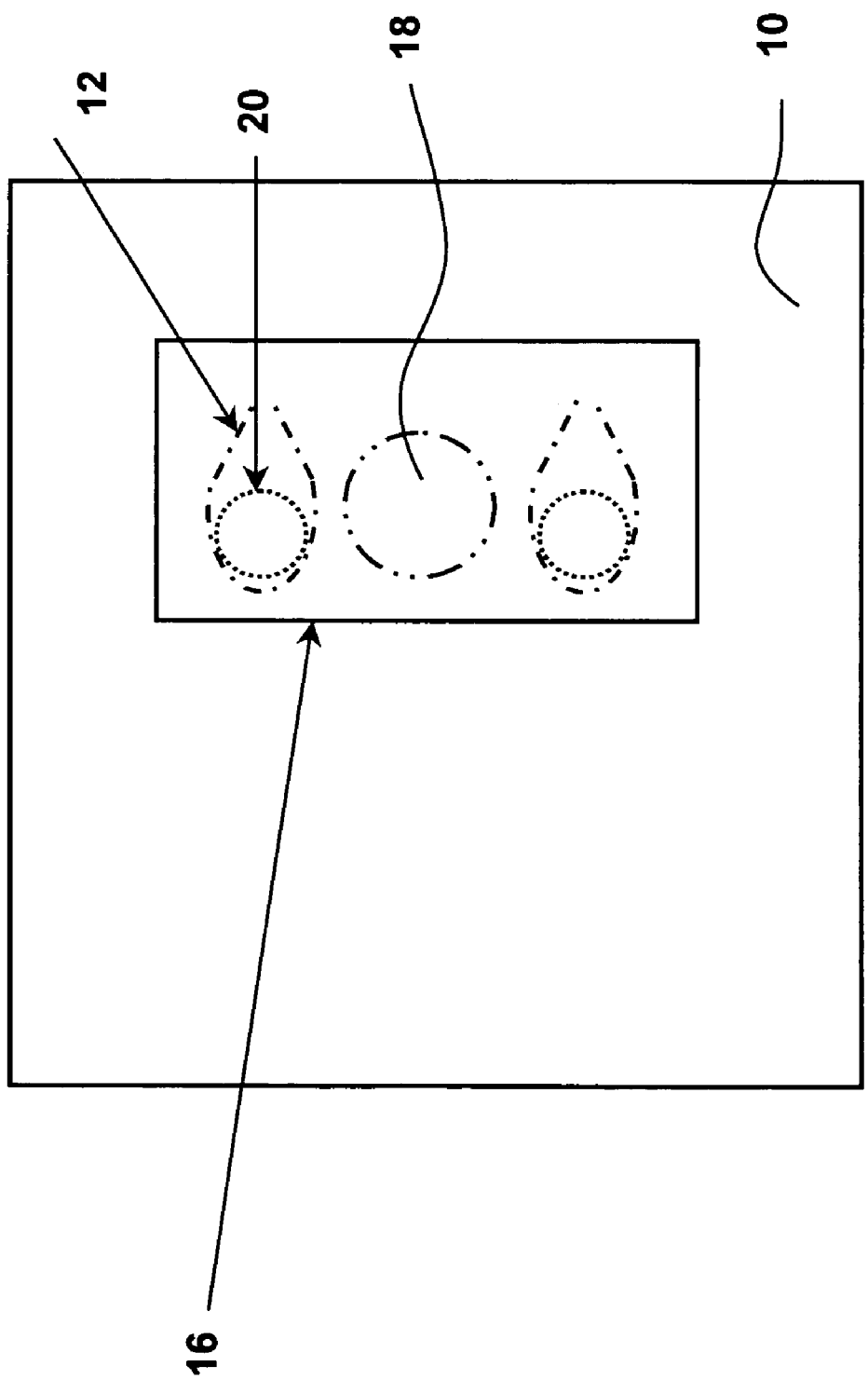
FIG. 4 is a top view illustrating exemplary solder bumps and pads on the substrate and the photodiode chip.

As seen in FIG. 4, the solder bumps are conveniently of a circular shape. While FIG. 2 shows the pads on the substrate and the solder bumps on the chip (element) 16, it is within the scope of the invention to reverse this arrangement so that the pads are provided on the chip and the solder bumps on the substrate, as long as the shape of the pads is asymmetrical or symmetrical pads are asymmetrically offset a predetermined amount enabling a non-uniform flow of the solder upon heating and consequential predetermined tilt of the chip relative to the substrate. It is also conceivable to provide solder pads on both the substrate and the chip (element), one set or both set of the pads being asymmetrical, and place solder bumps on either the substrate pads or the chip pads before assembly.

Figure 6B:
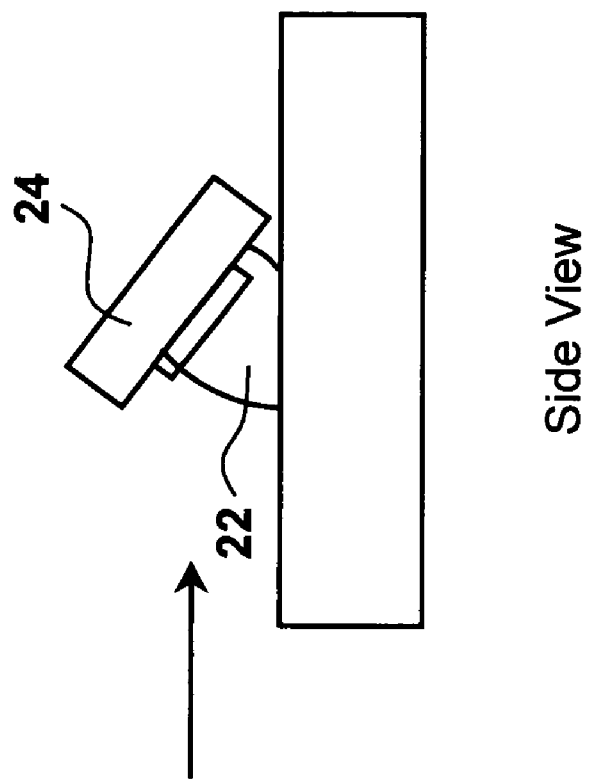
FIGS. 6a and 6b shows the front view and side view, respectively, of the substrate and a photodiode submount after the reflow of the solder.

As shown by way of example in FIG. 5, numerous shapes of the asymmetric pads are possible, the objective being that the solder flow non-symmetrically upon heating (as explained hereinbelow) and that the amount of the solder relative to the size of the pad was sufficient to form a "hill" 20 (FIG. 6b) to promote the tilt of the chip.

Once the temporary immobilization of the chip 16 on the substrate 10 takes place (FIG. 3), the chip being otherwise unsupported by pick-up head 14 or other means, the assembly is placed at elevated temperature, e.g. on a heating tray. It can be seen that the chip 16 at this stage is disposed horizontally (in parallel) relative to the substrate, for example as a result of its release from the pick-up head 14.

The temperature of the heating step is selected such that the solder 12 undergoes a reflow over the surface of the corresponding pad, forcing the chip to tilt to one side about the axis formed by the two (or more) pads.

Figure 6A:
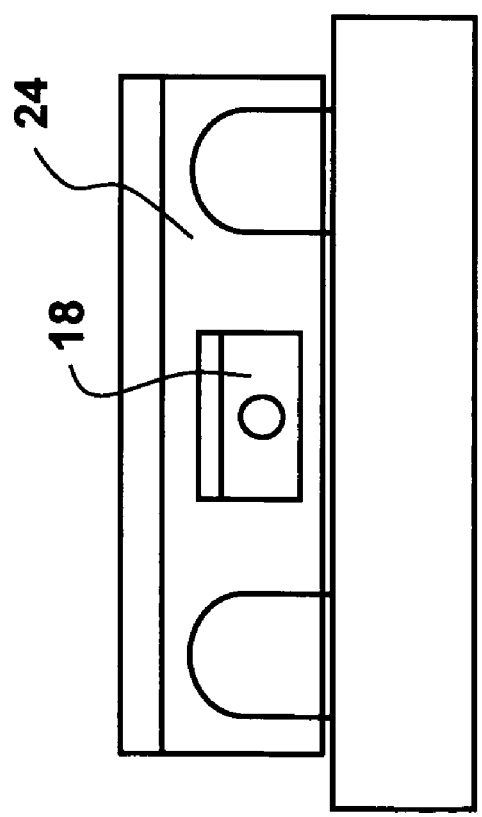

The result of this operation is shown in FIG. 6a (front view) and 6b (side view). It will be seen that the tilted position of the chip enables exposure of the photodiode active area 18 to a light beam that may be incident on the photodiode from a direction indicated by an arrow in FIG. 6b. It will also be noted that the assembly of FIG. 6a and 6b includes a submount 24 to which the chip is permanently secured.

While the present disclosure and drawings describe and illustrate a single photodiode assembly, it will be recognized that the invention may be used in the assembly of a large array of small electronic elements. In this context, the known technologies (MEMS, bump transfer, bump printing, flip-chip) can be used in a routine manner to produce an array of relatively uniform tilted elements on a substrate in a controlled manner.

Figure 7:
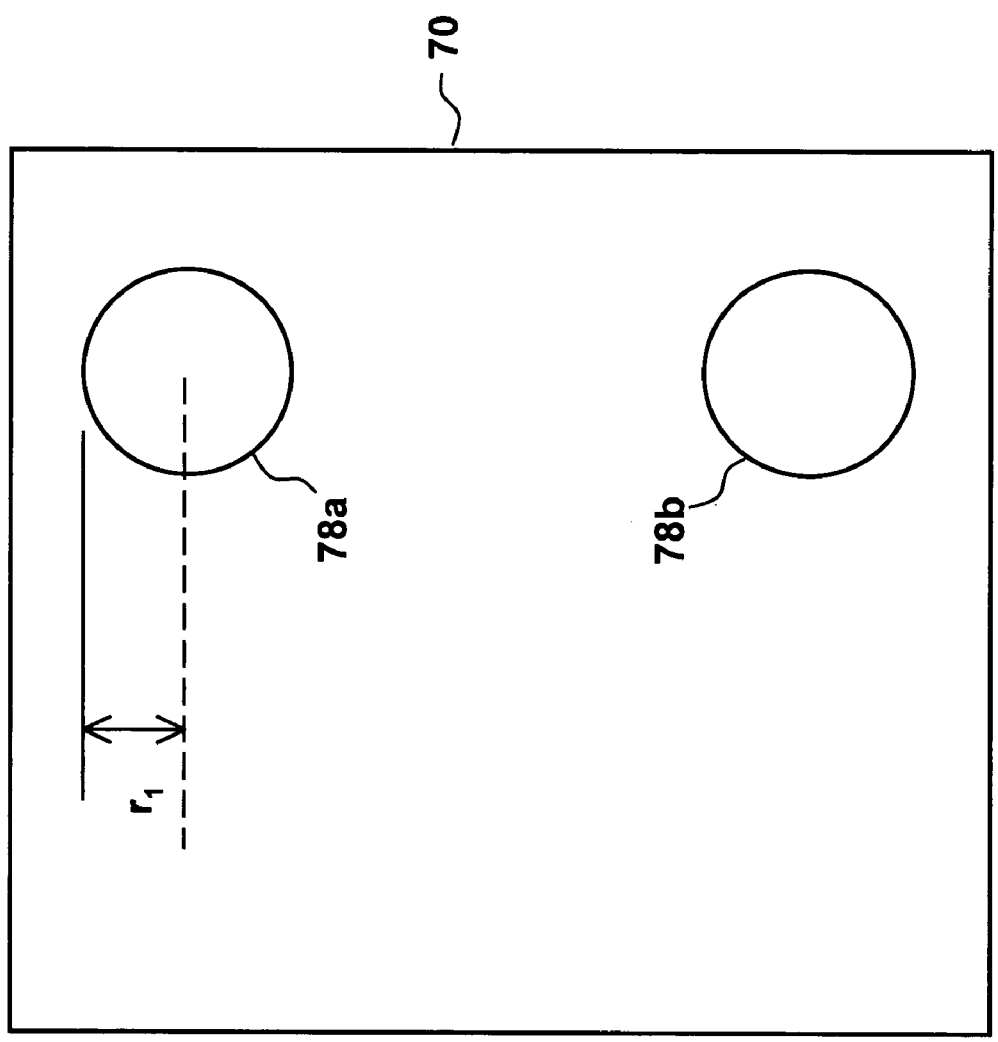
FIG. 7 is a plan view of two solder bumps being disposed such that they are offset from central axis of two rectangular pads.
Figure 8:
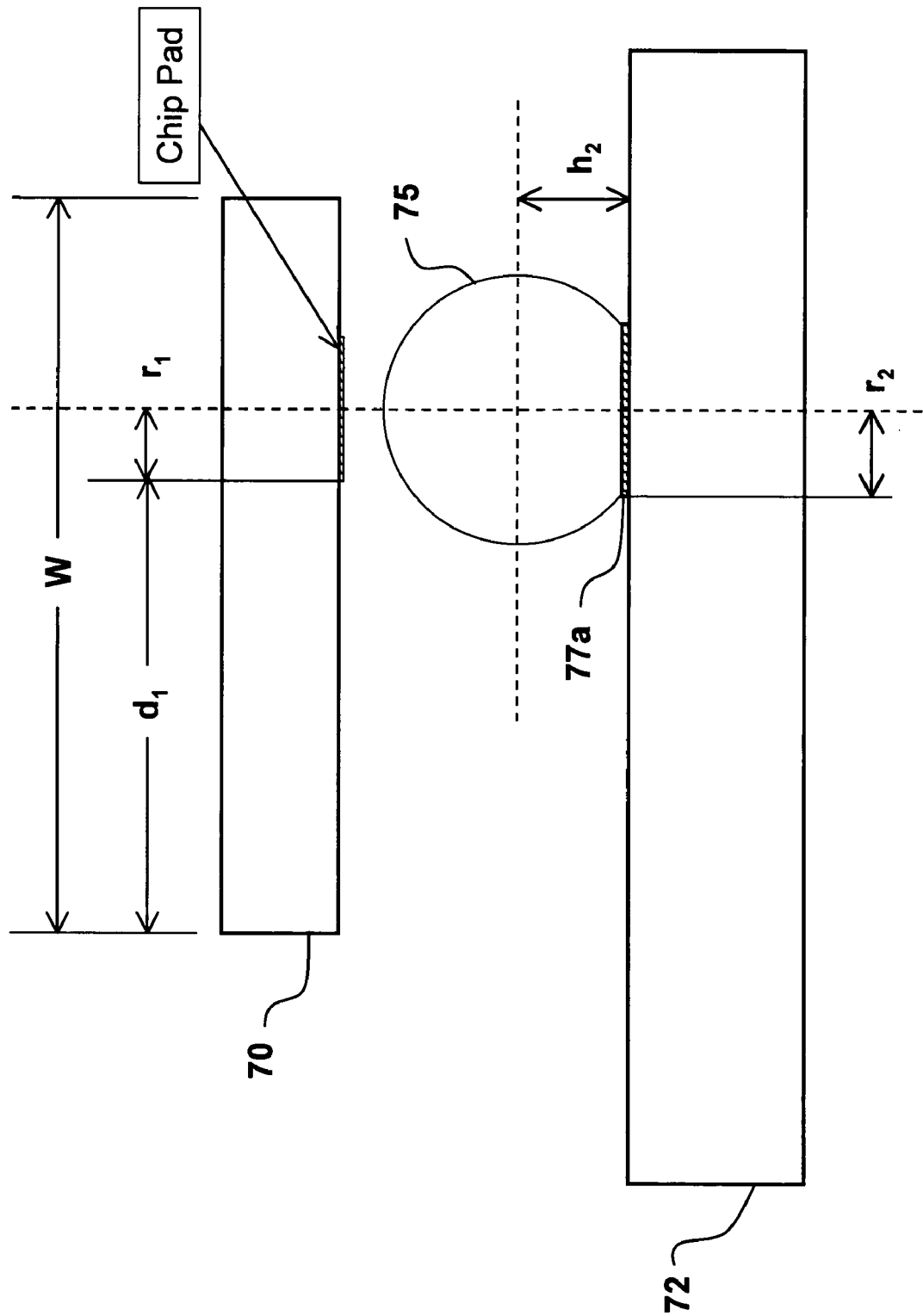
FIG. 8 is a side view of a chip with circular bond pad over substrate with solder bump on circular bond pad.

In addition to placing solder bumps on asymmetrically shaped pads on either the substrate or component to be soldered at a predetermined angle to the substrate, it has been discovered that this invention can be realized by placing symmetrically shaped pads asymmetrically on solder bumps, or alternatively, locating solder bumps asymmetrically on symmetrical shaped pads as is shown in FIG. 5a. For example, in FIG. 7, similar to that of FIG. 4, two symmetrically-shaped circular solder pads 78a and 78b are provided on a chip 70, to be mounted on a substrate 72. Other symmetrically shaped pads may be used. By way of definition, symmetrically shaped pads include circular pads, square pads, rectangular pads, and other shaped pads which are symmetrical about two orthogonal axes. FIG. 8 is a side view of the chip 70 positioned above the substrate 72 with solder bumped pads 77a shown and 77b not shown. The solder bump 75 on the substrate 72 has been melted wetting out to the edge of the substrate pad 77a and then solidified into a spherical shape. The radii of the pads on the chip 70 and the substrate are $r_1$ and $r_2$ respectively as shown.

For the purpose of convenient calculation in this exemplary embodiment, circular pads have been used; and, although circular solder pads are often used other shapes are possible. In this example the chip 70 and substrate 72 contains a single row of two pads. The chip with dimension W has its row of pads located to one side of the symmetry line.

Figure 9:
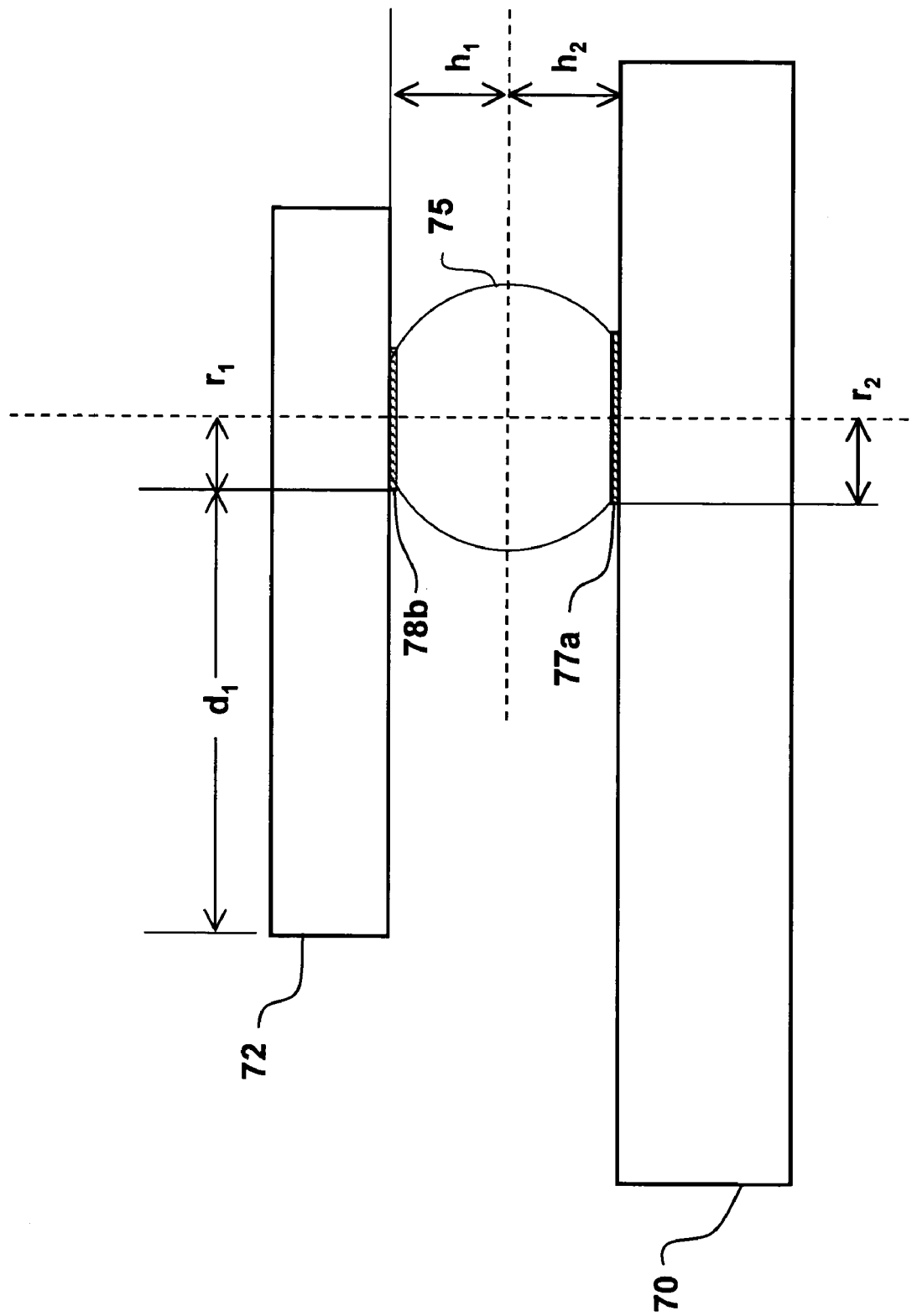
FIG. 9 is a side view of the chip of FIG. 8 joined to the substrate with the solder melted and wetted to the pad on the chip.

FIG. 9 shows the chip 70 joined to the substrate 72 with the solder melted and wetted to the pad 78b on the chip 70. This can be accomplished with several well-established methods. In one a machine holds the chip and places it such that the pads 78a and 78b on the chip 70 align to and touch the solder bumps on the substrate. While holding the chip in place heaters (not shown) are activated which raise the temperature of the chip 70 and substrate 72 until the solder melts. In another method called "tack bonding" the chip is aligned as before but is pressed down on the solder causing the solder to deform at the interface to the chip pad in such a way as to form a temporary bond similar to cold welding. The chip tacked to the substrate can then be moved to a reflow machine to melt the solder and as above cause the solder to completely wet out onto the chip's pad.

Figure 10:
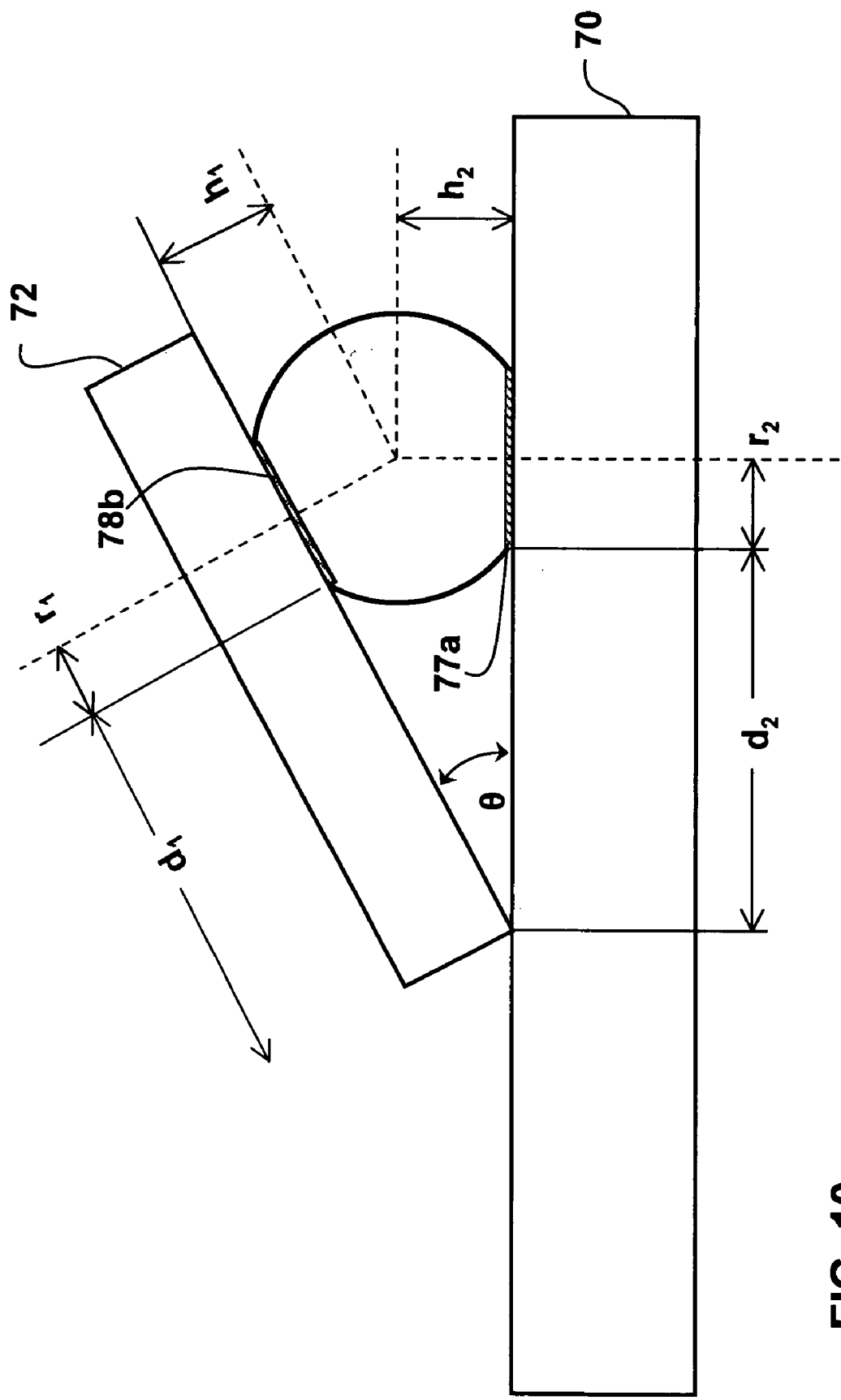
FIG. 10 is a side view of the chip under the influence of gravity chip rotates about solder bump until it stops against substrate.

Once the solder is melted the chip under the influence of gravity will tip over on the side with the larger overhang, as is shown in FIG. 10. In this embodiment shown, if the solder is sufficiently heated the chip 70 will tilt over until it comes into contact with the substrate 72. The angle θ between the chip and substrate is then determined by the height of the solder bump ($h_1+h_2$) and the distance from the center of the chip pad to the edge of the chip ($d_1+r_1$).

$$\theta = \tan^{-1}(h_1/(d_1+r_1)) + \tan^{-1}(h_2/\sqrt{h_1^2-h_2^2+(d_1-r_1)^2})$$

Solder Surface Tension Tilt

Figure 11:
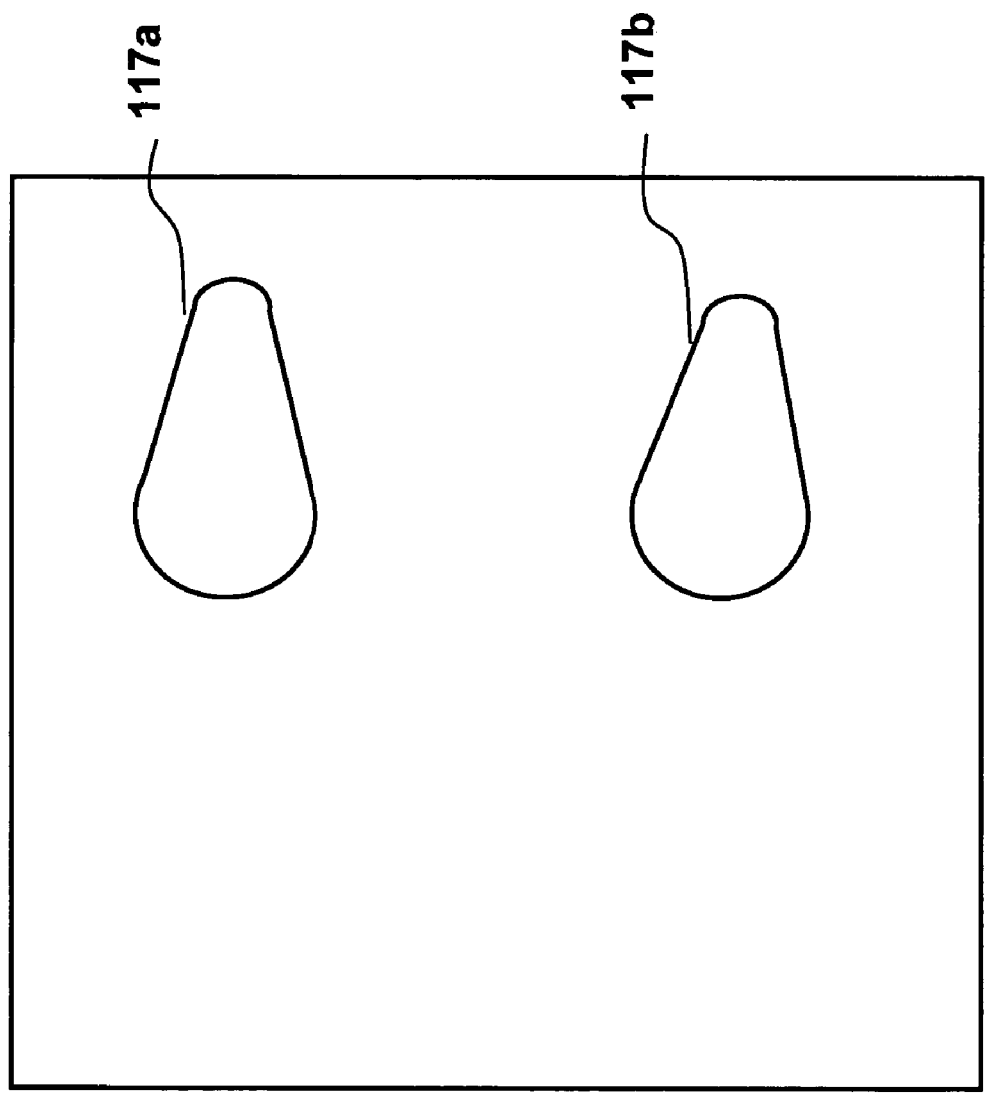
FIG. 11 is a top view of the chip shown having offset pear shaped pads designed to achieve controlled tilt toward the small side of the pads.
Figure 12:
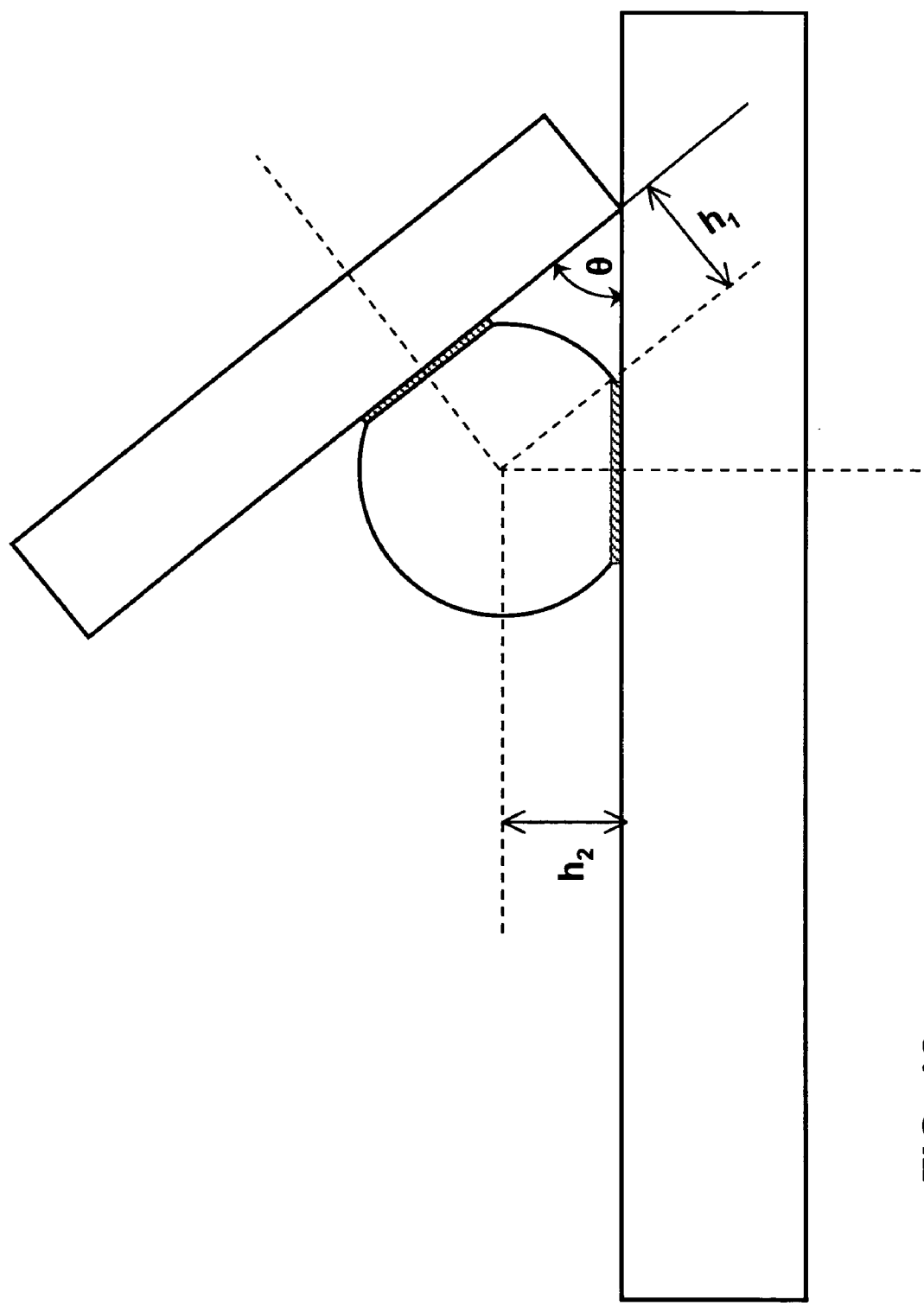
FIG. 12 is a side-view of the chip of FIG. 11 wherein the tilt is opposite to the direction of gravity forces.

The force of gravity that tilts the chip over in the instance shown in FIG. 10 can be overcome with when the shape of the solder joint is designed such that surface tensions in the molten solder act opposite to the gravity. FIG. 11 illustrates a pad design with pads 117a and 117b similar in shape to pads shown in FIG. 4 however located asymmetrically on the chip 70 so as to be off centre. FIG. 12 shows the surprising effect of this pad design after joining. The surface tension described here is that of the solder which has the effect of exerting forces on both the chip and the substrate. In the instance where a circular pad is used, for example in FIG. 7, the solder takes on a spherical shape and there is no net force acting between the chip 70 and the substrate 72. In the pear shaped embodiment of FIG. 11 solder surface tensions act to cause the solder to bulge on the "fat" side of the pear shaped pad and contract on the narrow side. This pulls the chip toward the substrate on the narrow side of the pad. This surface tension force is large compared to the counterbalancing force of gravity. In FIG. 12 the chip tilts over due to surface tension, until the edge of the chip hits the substrate. The angle of the chip relative to the substrate is thus determined in a way similar to the circular case by controlling the solder volume and the position of the pad relative to the edge of the chip.

By controlling the pad shape, and or location of the solder bumps on the pad and location of the pads, a predetermined amount of tilt can be achieved by heating alone, without further fixturing once the chip is tacked to the substrate resting on the solder bumps. This has been modeled on a computer and by varying these parameters in a controlled manner, the amount of tilt can be determined. Alternatively, one can empirically determine the amount of tilt that will result by simple trial and error with different shaped pads disposed at different locations in order to predetermine an amount of tilt that will result on subsequent chips.

Figure 13:
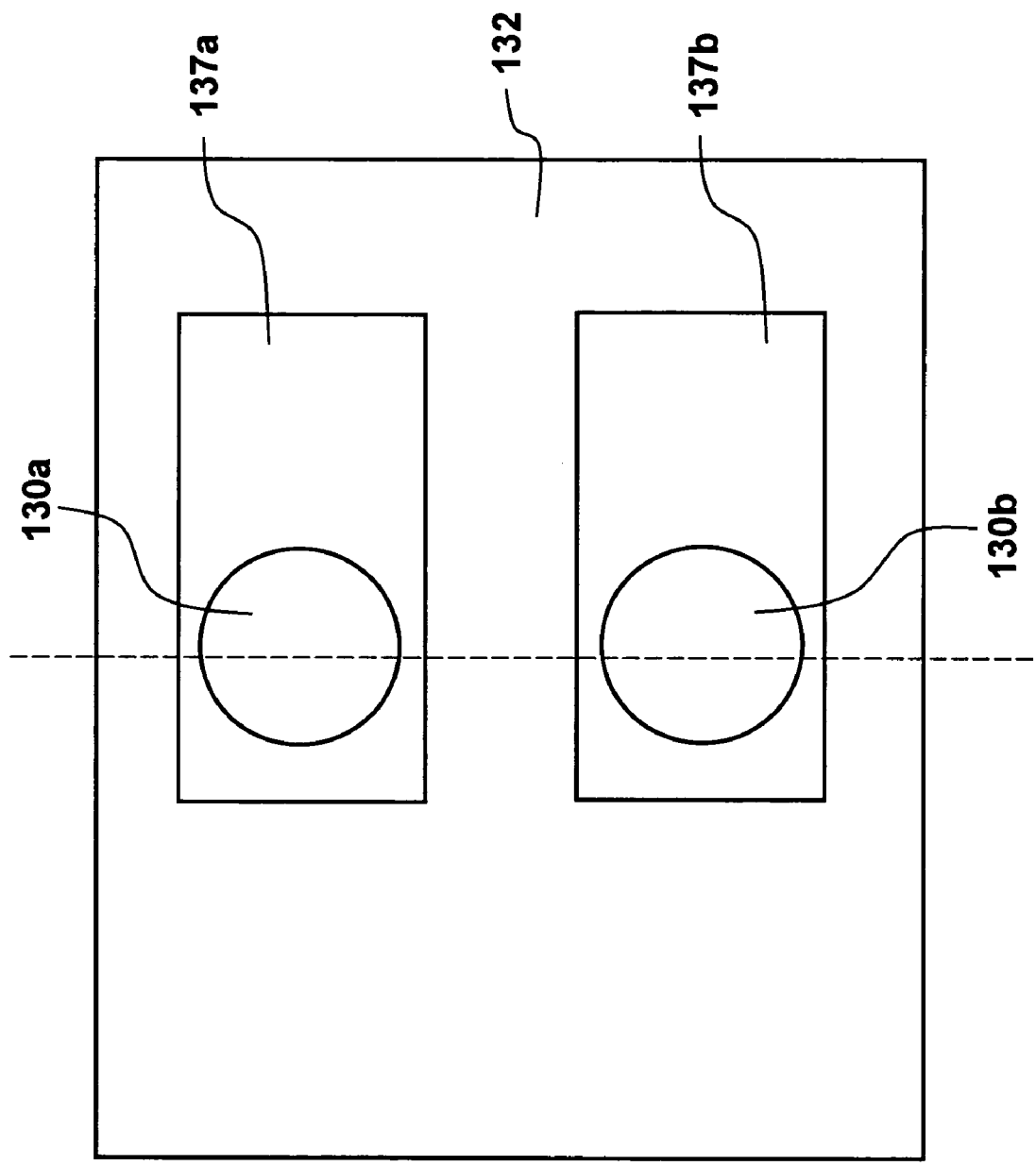
FIG. 13 illustrates an embodiment where symmetrically shaped pads are disposed asymmetrically with respect to the centre line of the chip and wherein the solder bumps are located asymmetrically on the solder pad.

FIG. 13 illustrates on embodiment wherein solder bumps 130a and 130b are placed asymmetrically on symmetrical shaped rectangular pads 137a and 137b on a substrate 132 having an effect similar to that of the pear shaped pad shown heretofore.

In summary, this invention provides several design criteria not heretofore known that will allow a chip to be bonded to a substrate resting upon solder bumps, where a predetermined angle can be achieved between the substrate and chip or component without holding the chip at the desired angle. The forces of gravity and or surface tension provided by melting solder bumps on an asymmetrically shaped pad can provide a controlled predetermined angle to result.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A method of bonding an element to a substrate, the method comprising the steps of:
   a) providing a substrate having a generally flat surface,
   b) placing two or more solder bumps having a predetermined volume on either the substrate or on the element, the bumps defining a single axis, c) determining a shape, size and location of two or more solder pads on the other of the substrate or element so as effect a predetermined orientation of the element at a predetermined angle with respect to the substrate during heating and melting of the solder bumps, d) effecting a contact of the element with the substrate via the solder bumps, such that the element is supported on the solder bumps only in a first supported position, and e) after step (d) heating the solder bumps in the absence of any further supporting or orienting of the element to cause a flow of the solder bumps and to cause a predetermined tilting displacement of the element by gravity forces and by surface tension forces substantially about the axis defined by the solder bumps so as to re-orient the element at a predetermined angle in a second secured position between angles greater than 0 and less than 90 degrees with respect to the substrate by said heating alone.

2. The method according to claim 1 wherein the element is attached to a transfer device before the step d).

3. The method as defined in claim 1 including the step of providing means for asymmetrical flow of the solder bumps upon melting.

4. The method of claim 1 wherein an unequal force of the liquid solder surface tension about the solder bumps in a predetermined direction in accordance with the shape, size and location of the pads, during melting of the solder exceeds that of gravity and ensures the chip will rest at the predetermined angle and orientation.

5. The method as defined in claim 1, wherein the element after step (e) tilts until it makes contact with substrate.

6. The method as defined in claim 3, wherein the element after step (e) tilts until it makes contact with substrate.

7. The method of claim 3 wherein the pads are disposed on the element and the solder bumps are disposed on the substrate.

8. The method of claim 1 wherein at least two solder bumps are disposed on two pads in an asymmetric fashion such that upon melting the solder, a significantly greater amount of solder is melted one side of each pad than an opposite side of each pad about the solder bumps.

9. The method of claim 1 wherein the step of effecting a contact of the element with the substrate via the solder bumps includes the step of heating the solder so that the element is tacked to the solder and supported in the first supported position.

10. The method of claim 1 wherein the step d) comprises contacting the element with the solder bumps, melting the solder bumps and solidifying the solder bumps to cause immobilization of the element on the solder bumps without a direct contact between the element and the substrate.

11. A method of bonding an element to a substrate, the method comprising the steps of;

a) providing a substrate having a generally flat surface, b) placing two or more solder bumps having a predetermined volume on either the substrate or on the element, the bumps defining a single axis, c) providing at least two pads on the other of the substrate or the element for contacting with the solder bumps placed in step (b) wherein the size and location of two or more solder pads on the other of the substrate or element is selected so as effect a predetermined orientation of the element at a predetermined angle with respect to the substrate during heating and melting of the solder bumps, the shape of the pads being asymmetric about the single axis when a contact is made between the substrate and the element, d) effecting the contact of the element with the substrate via the solder bumps, such that the element is secured to and supported on the solder bumps only, and e) after step (d) heating the solder bumps in the absence of any further supporting or orienting of the element to cause a flow of the solder bumps and to cause a predetermined tilting displacement of the element by gravity force and by surface tension force substantially about the axis defined by the solder bumps so as to orient the element at a predetermined angle between and including angles of 0 and 90 degrees with respect to the substrate by said heating alone.

12. A method as defined in claim 11, wherein each of the at least two pads are symmetric about two orthogonal axes, and wherein the solder bumps contact the pads and are secured thereto in an asymmetrical fashion such that the location of the solder bumps on the pad is substantially offset from the geometrical centre of the symmetric pad.

13. A method as defined in claim 11, wherein each of the at least two pads are symmetrical about a centre point and wherein the solder bumps contact the pads and are secured thereto in an asymmetrical fashion such that the location of the solder bumps on the pad is substantially offset from the geometrical centre of the pad.

14. A method as defined in claim 11, wherein the tilting displacement is caused primarily by surface tension of the solder so as to pull the element in a predetermined direction countering forces of gravity that would otherwise tilt the chip in a different direction.

15. A method as defined in claim 11 wherein the tilting displacement is caused by surface tension of the solder and gravity.

16. A method as defined in claim 11, wherein the element tilts until it makes contact with the substrate, and wherein the direction of tilt, is opposite to tilt that would otherwise have occurred in the presence of gravity and absent the surface tension force of the solder.

17. A method as defined in claim 11 wherein the surface tension force is greater than the force of gravity.

* * * * *